(12) United States Patent
Cheon et al.

(10) Patent No.: US 8,187,916 B2
(45) Date of Patent: May 29, 2012

(54) LIQUID COMPOSITIONS FOR INKJET PRINTING OF ORGANIC LAYERS OR OTHER USES

(75) Inventors: Kwang-Ohk Cheon, Holland, PA (US); Chuanjun Xia, Lawrenceville, NJ (US); Suman Layek, Lawrenceville, NJ (US)

(73) Assignee: Universal Display Corporation, Ewing, NJ (US)

( * ) Notice: Subject to any disclaimer, the term of this patent is extended or adjusted under 35 U.S.C. 154(b) by 189 days.

(21) Appl. No.: 12/797,163

(22) Filed: Jun. 9, 2010

(65) Prior Publication Data

US 2010/0323464 A1    Dec. 23, 2010

Related U.S. Application Data

(60) Provisional application No. 61/187,862, filed on Jun. 17, 2009.

(51) Int. Cl.
*H01L 51/40* (2006.01)
*H01L 21/00* (2006.01)
*H01L 21/20* (2006.01)

(52) U.S. Cl. .............. 438/99; 438/22; 438/478
(58) Field of Classification Search .......... None
See application file for complete search history.

(56) References Cited

U.S. PATENT DOCUMENTS

| 7,704,785 B2 * | 4/2010 | Steiger et al. ............ 438/99 |
| 7,815,303 B2 * | 10/2010 | Kasai ..................... 347/102 |
| 2006/0113897 A1 | 6/2006 | Fukase |
| 2007/0069185 A1 * | 3/2007 | Hsu et al. ................ 252/500 |
| 2007/0172698 A1 | 7/2007 | Iwakuma et al. |
| 2007/0216743 A1 * | 9/2007 | Makuta et al. ........... 347/100 |
| 2008/0199600 A1 * | 8/2008 | Spreitzer et al. ......... 427/125 |
| 2009/0130296 A1 | 5/2009 | Kwong et al. |
| 2009/0315023 A1 * | 12/2009 | Wallace et al. .......... 257/40 |

FOREIGN PATENT DOCUMENTS

| EP | 1 850 368 | 10/2007 |
| EP | 1985643 | 10/2008 |
| GB | 2460216 | * 11/2009 |
| WO | WO 02/069119 | 9/2002 |

OTHER PUBLICATIONS

PCT International Search Report and Written Opinion for PCT/US10/37920 mailed on Sep. 3, 2010.
U.S. Appl. No. 12/369,525, filed Feb. 11, 2009 to Cheon et al.

* cited by examiner

*Primary Examiner* — Scott B Geyer
(74) *Attorney, Agent, or Firm* — Kenyon & Kenyon LLP

(57) ABSTRACT

A method of forming an organic layer for an organic electronic device (e.g., an OLED) by using a liquid composition comprising a small molecule organic semiconductor material mixed in a solvent preparation in which the content of higher boiling impurities is reduced. The solvent preparation comprises a high boiling point solvent and 0.1 wt % or less of impurities having a higher boiling point than the solvent. The liquid composition is deposited on a surface by inkjet printing to form the organic layer. Also, provided are liquid compositions which can be used to make organic layers.

21 Claims, 10 Drawing Sheets

After printing | After 10 minutes of vacuum drying ethyl benzoate benzyl acetate 1-tetralone

LIQUID COMPOSITIONS FOR INKJET PRINTING OF ORGANIC LAYERS OR OTHER USES

REFERENCE TO RELATED APPLICATIONS

The present application claims the benefit of priority to U.S. Provisional Application No. 61/187,862, filed Jun. 17, 2009.

RESEARCH AGREEMENTS

The claimed invention was made by, on behalf of, and/or in connection with one or more of the following parties to a joint university-corporation research agreement: Princeton University, The University of Southern California, and Universal Display Corporation. The agreement was in effect on and before the date the claimed invention was made, and the claimed invention was made as a result of activities undertaken within the scope of the agreement.

TECHNICAL FIELD

The present invention relates to methods for making organic layers in organic electronic devices, such as organic light emitting devices.

BACKGROUND

Traditionally, organic light emitting devices (OLEDs) have been fabricated by vacuum deposition for small molecule materials, and by spin-coating or dip coating for polymeric materials. More recently, inkjet printing has been used to directly deposit organic thin film layers in the fabrication of OLEDs. For inkjet printing of polymeric materials, a variety of conventional solvents can be used, such as toluene or xylene. However, these solvents conventionally used for inkjet printing of polymeric materials often do not work as well for the deposition of small molecule materials. Thus, there is a need for an improved inkjet fluid formulation suitable for the inkjet printing of small molecule materials to form organic layers.

SUMMARY

The present invention provides an improved method of forming an organic layer by solution processing (e.g., inkjet printing) using a solvent preparation in which the content of higher boiling point impurities is reduced. Organic electronic devices, such as OLEDs, using organic layers deposited by the method may have improved device performance.

In one embodiment, the present invention provides a method of forming an organic layer for an organic electronic device, comprising: providing a liquid composition comprising a small molecule organic semiconductor material mixed in a solvent preparation, the solvent preparation comprising a solvent and 0.1 wt % or less of impurities having a higher boiling point than the solvent, the solvent having a boiling point of 200° C. or higher at 1 atm; and depositing the liquid composition on a surface. The deposition may be performed by inkjet printing or other solution processing technique. The solvent preparation may be made by redistillation of a commercially-obtained solvent preparation.

In another embodiment, the present invention provides a liquid composition comprising: a solvent having a boiling point of 200° C. or higher at 1 atm; and a small molecule organic semiconductor material mixed in the solvent at a concentration in the range of 0.01-10 wt %; wherein the liquid composition has 0.1 wt % or less of impurities having a higher boiling point than the solvent. Various solvents may be used in the liquid composition, including 3-phenoxytoluene or 1-tetralone.

DETAILED DESCRIPTION

Figure 1:
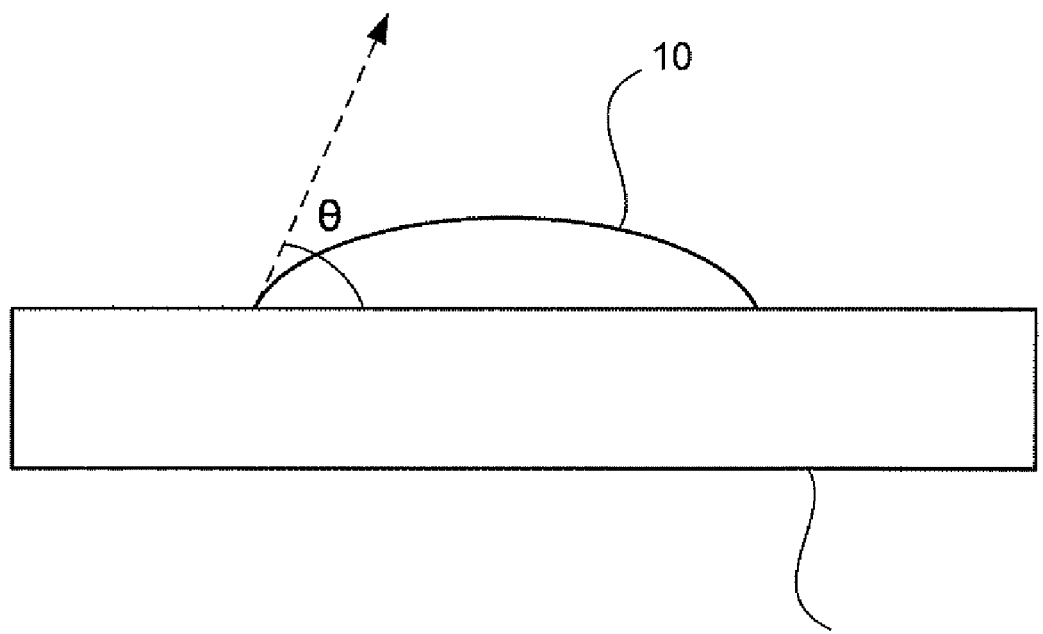
FIG. 1 shows a droplet of a ketone solvent of the present invention applied onto a planar, untreated surface made of indium tin oxide with the wetting contact angle θ being measured.

The meaning of the following terms, as intended to be used herein, are as follows:

The term "aliphatic" means a saturated or unsaturated hydrocarbyl in a linear, branched, or non-aromatic ring. The carbons can be joined by single bonds (alkyls), double bonds (alkenyls), or triple bonds (alkynyls). Besides hydrogen, other elements such as oxygen, nitrogen, sulfur, or halogens can be bound to the carbons as substitutions. The term "aliphatic" also encompasses hydrocarbyls containing heteroatoms, such as oxygen, nitrogen, sulfur, phosphorus, and silicon in place of carbon atoms.

The term "alkyl" means alkyl moieties and encompasses both straight and branched alkyl chains. Additionally, the alkyl moieties themselves may be substituted with one or more substituents. The term "heteroalkyl" means alkyl moieties that include heteroatoms.

The term "lower," when referring to an aliphatic or any of the above-mentioned types of aliphatics, means that the aliphatic group contains from 1-15 carbon atoms. For example, lower alkyl groups include methyl, ethyl, propyl, isopropyl, butyl, isobutyl, tent-butyl, and the like.

The term "aryl" means a hydrocarbyl containing at least one aromatic ring, including single-ring groups and polycyclic ring systems. The term "heteroaryl" means a hydrocarbyl containing at least one heteroaromatic ring (i.e., containing heteroatoms), including single-ring groups and polycyclic ring systems. The polycyclic rings may have two or more rings in which two carbon atoms are common by two adjoining rings (i.e., the rings are "fused"), wherein at least one of the rings is aromatic or heteroaromatic. The term "lower aryl" or "lower heteroaryl" means an aryl or heteroaryl, respectively, containing from 3-15 carbon atoms.

Examples of aryl groups include benzene, naphthalene, anthracene, phenanthrene, perylene, tetracene, pyrene, benzpyrene, chrysene, triphenylene, acenaphthene, fluorene, and those derived therefrom. Examples of heteroaryl groups include furan, benzofuran, thiophen, benzothiophen, pyrrole, pyrazole, triazole, imidazole, oxadiazole, oxazole, thiazole, tetrazole, indole, carbazole, pyrroloimidazole, pyrrolopyrazole, pyrrolopyrole, thienopyrrole, thienothiophen, furopyrrole, furofuran, thienofuran, benzoisoxazole, benzoisothiazole, benzoimidazole, pyridine, pyrazine, pyridazine, pyrimidine, triazine, quinoline, isoquinoline, cinnnoline, quinoxaline, phenanthridine, benzoimidazole, perimidine, quinazoline, quinazolinone, azulene, and those derived therefrom.

The present invention relates to the forming of organic layers by solution processing techniques. In one aspect, the present invention provides a method of forming an organic layer. The method comprises providing a liquid composition comprising a small molecule organic semiconductor material mixed in a ketone solvent. The liquid composition is then deposited on a surface and dried to form the organic layer.

By "ketone solvent," we mean that the solvent compound has one or more ketone functional groups in the molecular structure. In certain embodiments, the ketone solvent is an aromatic ketone solvent. By "aromatic ketone solvent," we mean that the solvent molecule includes one or more aryl or heteroaryl groups and one or more ketone functional groups.

In certain embodiments, the aromatic ketone solvent is a tetralone solvent. By "tetralone solvent," we mean that the solvent compound is or contains a bicyclic ketone in which a phenyl ring is fused with a cyclohexanone. Examples of tetralones that can be used in the present invention include 1-tetralone and 2-tetralone shown below. The chemical and/or physical properties of 1-tetralone and 2-tetralone are known in the art or can be readily determined by conventional techniques. For example, 1-tetralone is known to have a boiling point of 256° C. (at 1 atm), density of 1.1 g/cm³ (at 20° C.), melting point of 5-6° C. (at 1 atm), and molecular weight of 146.

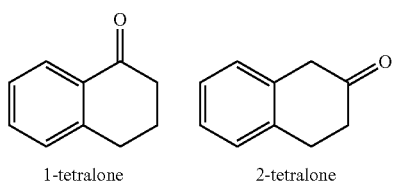

1-tetralone      2-tetralone

The term "tetralone solvent" is also intended to encompass derivatives of 1-tetralone and 2-tetralone in which there are one or more substitutions on either or both of the rings (i.e., the phenyl and cyclohexane rings). Such substitutions include lower aliphatic, lower aryl, lower heteroaryl, or halogen. As such, other examples of tetralone solvents that can be used in the present invention include 2-(phenylepoxy)tetralone and 6-(methoxy)tetralone Other examples of aromatic ketone solvents that can be used in the present invention include acetophenone (methyl phenyl ketone), propiophenone (ethyl phenyl ketone), benzophenone (diphenyl ketone), and their derivatives, such as 4-methylpropiophenone.

TABLE 1

|  | acetophenone | propiophenone | Benzophenone |
|---|---|---|---|
| Boiling point (at 1 atm) | 202° C. | 218° C. | 305° C. |
| Density (at 20° C.) | 1.03 g/cm³ | 1.01 g/cm³ | 1.11 g/cm³ |
| Melting point (at 1 atm) | 19-20° C. | 19° C. | 48° C. |
| Molecular weight | 120 | 134 | 182 |

Other ketone solvents that may be used in the present invention do not have an aryl or heteroaryl group. One such example of a ketone solvent is isophorone as shown below, which has a boiling point of 215° C. (at 1 atm), density of 0.92 g/cm³ (at 20° C.), melting point of −8° C. (at 1 atm), and a molecular weight of 138.

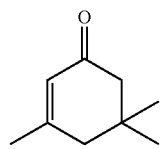

In some cases, the ketone solvent may be a blend of two or more ketone solvents. One such example of a blended ketone solvent is EASTMAN C-11 KETONE™ (Eastman), which has a boiling point of 200° C. at 1 atm, melting point of −12° C., and density of 0.84 mg/cm³. In some cases, the liquid composition itself may use a blend of solvents, including solvents that are not ketones solvents of the present invention. In such cases, the ketone solvent(s) constitutes at least 50% (by volume) of the solvent volume in the liquid composition.

The ketone solvents used in the present invention may have various chemical/physical properties that make it useful for forming organic layers by solution processing techniques, such as inkjet printing. For example, the ketone solvent may have a melting point of 25° C. or below. In some cases, the ketone solvent has a molecular weight in the range of 100-250. In some cases, the ketone solvent has a boiling point of 150° C. or greater, or 200° C. or greater; and in some cases, a boiling point in the range of 150° C.-350° C. or 200° C.-350°. Boiling points in this range may be useful in preventing nozzle clogging of the inkjet print head.

The organic semiconductor material is a small molecule organic compound (including organometallic compounds) which is capable of exhibiting semiconducting properties, i.e., in which the energy gap between conduction and valence bands is in the range of 0.1-4 eV. The small molecule organic semiconductor material may be any of those known or proposed to be used in the fabrication of organic electronic devices, such as organic light emitting devices. For example, the organic semiconductor material may be a charge transport compound (hole or electron transporting) or an emissive phosphorescent compound.

The term "small molecule" refers to any compound that is not a polymer, and "small molecules" may actually be quite large. Small molecules may include repeat units in some circumstances. For example, using a long chain alkyl group as a substituent does not exclude the molecule from being a "small molecule." In general, a small molecule has a well-defined chemical formula with a single molecular weight, whereas a polymer has a chemical formula and a molecular weight that may vary from molecule to molecule. The molecular weight of the small molecule organic semiconductor material is typically 3,000 or less.

In certain embodiments, the organic semiconductor material is a charge transport compound. Various types of charge transport compounds are known in the art, including triarylamines, phthalocyanines, metal phthalocyanines, porphyrins, metal porphyrins, indolocarbazoles, metal complexes, iminostilbene-containing compounds, and carbazole-containing compounds.

In certain embodiments, the organic semiconductor material has one or more cross-linking functional groups, which allows for the formation of a covalent bond with a reactive group on another molecule (such as another organic semiconductor material having a cross-linking functional group). For example, various types of charge transport compounds having cross-linking functional groups are known in the art. In some cases, the charge transport compound may be an organometallic complex having cross-linking functional groups, such as the cross-linkable iridium-ligand complexes described in U.S. Appln. Publication No. 2008/0220265 (Sep. 11, 2008) to Xia et al., which is incorporated by reference herein in its entirety. Such, cross-linkable iridium complexes include those having the general structure:

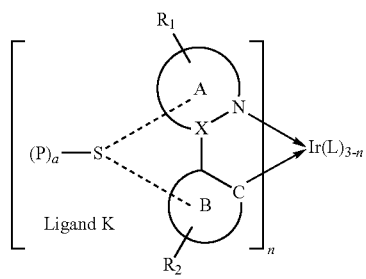

Each L represents a ligand that coordinates with the iridium, including any of various bidentate ligands which contain delocalized π-electrons, or which serve to improve the solubility (aqueous or organic), mesogenic property, or charge transport capability of the iridium complex. For example, the ligand L may be a phenylpyridine or acetylacetone.

Each K also represents a ligand, which comprises a structure $R_1$-A-B—$R_2$, spacer group S, and one or more cross-linkable functional groups P. The variable "n" has an integer value ranging from 1 to 3. Where n=1, the ligands L may be same or different from each other. Where n=2 or n=3, each of the ligands K may be same or different from each other. Example of cross-linkable functional groups P include vinyl, acrylate, epoxide, oxetane, trifluoroethylene, benzocyclobutene, siloxane, maleimide, cyanate ester, ethynyl, nadimide, phenylethynyl, biphenylene, phthalonitrile, or boronic acid.

The structure A-B represents a pair of aromatic rings that are bonded to each other. Rings A and B are each a 5 or 6-membered ring. Atom X on ring A represents a heteroatom, which may be nitrogen or carbon. The structure A-B is coordinated to the iridium via a nitrogen atom on ring A and an $sp^2$ hybridized carbon on ring B.

Each of rings A or B may optionally be substituted by substitution groups $R_1$ and $R_2$, wherein each of $R_1$ and $R_2$ represents one or more independently selected substitutions located at any position on their respective rings. $R_1$ or $R_2$ may be linked or fused to their respective rings. The $R_1$ and $R_2$ substitution groups can include lower aliphatic, lower aryl, or lower heteroaryl groups.

More examples of charge transport compounds having cross-linkable reactive functional groups include those disclosed in U.S. Application Publication No. 2004/0175638 to Tierney et al. (published 9 Sep. 2004), which is incorporated by reference herein. Other examples include the polymerizable triarylamine-containing perfluorocyclobutanes (PFCBs) disclosed in X. Jiang et al., Advanced Functional Materials, vol. 12:11-12, pp. 745-751 (December 2002). Other examples include the polynorbornenes with pendant triarylamine (TPA) groups described in E. Bellman et al., Chem. Mater., vol. 10:1668-1676 (1998). Other examples include the cross-linkable N,N'-bis-(m-tolyl)-N,N'-diphenyl-1,1'-biphenyl-4,4'-diamine (TPD)-based hole transport polymers described in B. Domercq et al., Chem. Mater., vol. 15:1491-1496 (2003). Other examples include the triarylamine-based hole transport molecules and polymers with pendant oxetane groups described in O. Nuyken et al., Designed Monomers & Polymers, vol. 5:2-3, pp. 195-210 (2002). Other examples include the cross-linkable or chain-extendable polyarylpolyamines described in U.S. Pat. No. 5,929,194 to Woo et al. (issued 27 Jul. 1999), which is incorporated by reference herein in its entirety.

Other examples include the hexa-alkoxytriphenylenes having acrylate groups described in A. Bacher et al., Macromolecules, vol. 32:4551-4557 (1999). Other examples include the cross-linkable hole-conducting polymers described in E. Bacher et al, Macromolecules, vol. 38:1640-1647 (2005). Other examples include the reactive benzodithiophenes described in U.S. Pat. No. 6,913,710 to Farrand et al. (issued 5 Jul. 2005), which is incorporated by reference herein in its entirety. Other examples of charge transport compounds having cross-linking groups are described in Muller et al., Synthetic Metals 111/112:31-34 (2000) and U.S. Appln. Publication No. 2005/0158523 (Gupta et al.), which are incorporated by reference herein. Other examples of charge transport compounds having cross-linkable reactive groups include styryl group-bearing arylamine derivatives such as $N^4,N^{4'}$-di(naphthalen-1-yl)-$N^4,N^{4'}$-bis(4-vinylphenyl)biphenyl-4,4'-diamine:

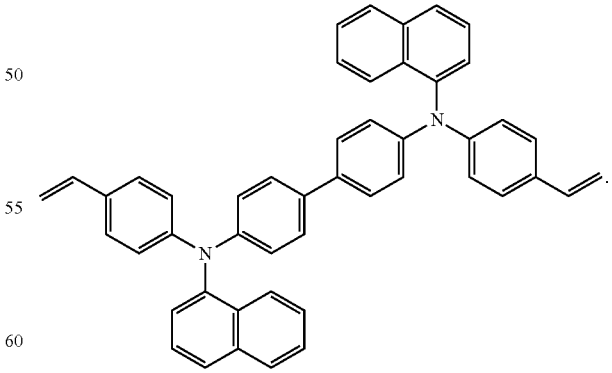

The concentration of the organic semiconductor material in the liquid composition will vary according to the particular application. In certain embodiments, the organic semiconductor material is provided at a concentration that is suitable for inkjet printing. In some cases, the concentration of the organic semiconductor material is in the range of 0.01-10 wt %; and in some cases, in the range of 0.01-2 wt %; and in some cases, in the range of 0.1-1 wt %. The viscosity of the liquid composition will vary according to the particular application. For use in inkjet printing, an appropriate viscosity can be in the range of 1-25 mPas or 5-25 mPas. The interaction of the ketone solvent with the organic semiconductor material may affect the viscosity of the liquid composition. As such, the viscosity of the liquid composition may be adjusted by varying the selection of the ketone solvent and/or the organic semiconductor material, or by varying the relative amounts of each. The liquid composition may also contain any of various other types of organic materials used in the fabrication of organic electronic devices, such as OLEDs.

The liquid composition is deposited onto the surface using any suitable solution processing technique known in the art. For example, the liquid composition can be deposited using a printing process, such as inkjet printing, nozzle printing, offset printing, transfer printing, or screen printing; or for example, using a coating process, such as spray coating, spin coating, or dip coating. After deposition of the liquid composition, the ketone solvent is removed, which may be performed using any conventional method such as vacuum drying or heating.

In embodiments where the organic semiconductor material has cross-linkable functional groups, the method may further comprise cross-linking of the organic semiconductor material to form the organic layer. Cross-linking may be performed by exposing the organic semiconductor material to heat and/or actinic radiation, including UV light, gamma rays, or x-rays. Cross-linking may be carried out in the presence of an initiator that decomposes under heat or irradiation to produce free radicals or ions that initiate the cross-linking reaction. The cross-linking may be performed in-situ during fabrication of the device.

Having a cross-linked organic layer may be useful in the fabrication of multi-layered organic electronic devices by solution processing techniques. In particular, a cross-linked organic layer can avoid being dissolved, morphologically influenced, or degraded by a solvent that is deposited over it. The cross-linked organic layer may be resistant to a variety of solvents used in the fabrication of organic electronic devices, including toluene, xylene, anisole, and other substituted aromatic and aliphatic solvents. Thus, with the underlying organic layer being cross-linked and made solvent resistant, the process of solution deposition and cross-linking can be repeated to create multiple layers.

As such, in certain instances, the method further comprises forming an additional (second) organic layer by solution processing over the cross-linked (first) organic layer. This additional (second) organic layer may be a charge transporting layer (e.g., a hole transporting layer) or an emissive layer.

The liquid composition may be deposited on a variety of different types of surfaces, including surfaces that are involved in the fabrication of organic electronic devices, such as OLEDs. In certain embodiments, the surface is hydrophilic relative to the ketone solvent used in the liquid composition. This feature may be useful for improving the ability of the liquid composition to wet the surface. As described in the Examples section below, sufficient wetting of the surface by the liquid composition can improve the quality of the organic layer that is formed. The ability of the solvent to sufficiently wet the surface can be demonstrated by the wetting contact angle of a droplet of the ketone solvent that is applied on the surface (or on a comparable test surface that is made of the same material as the actual surface).

For example, FIG. 1 shows a droplet 10 of a ketone solvent applied onto an untreated, planar surface 20 made of indium tin oxide. The wetting contact angle of the droplet 10 is the angle θ between the line tangential to the droplet 10 at the interface with the surface 20 and the plane of the surface 20 itself. Generally, the droplet 10 will diffuse radially on the surface 20 and the extent of radial diffusion increases with greater wetting of the surface 20 by the solvent. Because the contact angle θ decreases as the droplet 10 diffuses radially, a lower contact angle indicates greater wetting of the surface 20 by the solvent. As such, the ketone solvent and/or the surface may be selected such that a droplet of the ketone solvent applied onto the surface (or a test surface made of the same material as the actual surface) has a contact angle of 20° or less; and in some cases, 10° or less; and in some cases, 5° or less.

In another aspect of the present invention, the liquid composition comprises a small molecule organic semiconductor material mixed in an aromatic ether solvent. The liquid composition is then deposited on a surface and dried to form the organic layer. By "aromatic ether solvent," we mean that the solvent molecule is an ether having the general formula R—O—R', wherein at least one of R or R' contains an aryl, and wherein R and R' may be the same or different. In some cases, both R and R' contain an aryl. In some cases, the solvent molecule has the formula: (Aryl)-O-(Aryl), with each of the aryl groups being selected independently (i.e., they may be same or different).

The aromatic ether solvents used in the present invention may have various chemical/physical properties that make it useful for forming organic layers by solution processing techniques, such as inkjet printing. For example, the aromatic ether solvent may have a melting point of 25° C. or below. In some cases, the aromatic ether solvent has a molecular weight in the range of 100-250. In some cases, the aromatic ether solvent has a boiling point of 150° C. or greater, or 200° C. or greater; and in some cases, a boiling point in the range of 150° C.-350° C. or 200° C.-350° C. Boiling points in this range may be useful in preventing nozzle clogging of the inkjet print head.

Examples of aromatic ether solvents that may be suitable for use in the present invention are shown below in Table 2.

TABLE 2

| Name | Structure | MW | Density | BP (° C.) | MP (° C.) |
|------|-----------|----|---------|-----------|-----------|
| 3-Phenoxytoluene CAS: 3586-14-9 | 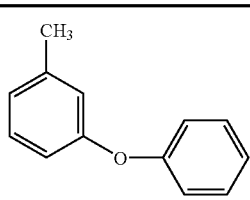 | 184 | 1.05 | 272 | Liquid at RT |

TABLE 2-continued

| Name | Structure | MW | Density | BP (° C.) | MP (° C.) |
|---|---|---|---|---|---|
| Butoxybenzene CAS: 1126-79-0 | C(CH₃)₃CH₃ on benzene | 150 | 0.93 | 210.3 | Liquid at RT |
| Benzyl butyl ether CAS: 588-67-0 | benzene—CH₂—O—(CH₂)₃CH₃ | 164 | 0.92 | 220 | Liquid at RT |
| p-Anisaldehyde dimethyl acetal CAS: 2186-92-7 | benzene with OCH₃ and CH(OCH₃)₂ | 182 | 1.07 | 253 | Liquid at RT |
| Tetrahydro-2-phenoxy-2H-pyran CAS: 4203-50-3 | pyran—O—phenyl | 178 | 1.08 | 274.7 | Liquid at RT |
| 1,2-Dimethoxy-4-(1-propenyl)benzene CAS: 93-16-3 | dimethoxy benzene with CH=CHCH₃ | 178 | 1.05 | 264 | Liquid at RT |
| 1,4-Benzodioxane CAS: 493-09-4 | benzodioxane | 136 | 1.17 | 216 | Liquid at RT |
| 1,3-Dipropoxy benzene CAS: 56106-37-7 | benzene with two OCH₂CH₂CH₃ | 194 | 0.98 | 251 | Liquid at RT |
| 2,5-Dimethoxytoluene CAS: 24599-58-4 | toluene with two OCH₃ | 152 | 1.05 | 218 | Liquid at RT |

TABLE 2-continued

| Name | Structure | MW | Density | BP (° C.) | MP (° C.) |
|---|---|---|---|---|---|
| 4-Ethylphenetole CAS: 1585-06-4 | | 150 | 0.94 | 205 | Liquid at RT |
| 1,2,4-Trimethoxy benzene CAS: 135-77-3 | | 168 | 1.13 | 247 | Liquid at RT |
| 4-(1-propenyl)-1,2-dimethoxybenzene CAS: 93-16-3 | | 178 | 1.05 | 264 | Liquid at RT |
| 1,3-Dimethoxy benzene CAS: 151-10-0 | | 138 | 1.07 | 217 | −52 |
| Glycidyl phenyl ether CAS: 122-60-1 | | 150 | 1.11 | 245 | 3.5 |
| Dibenzyl ether CAS: 103-50-4 | | 198 | 1.04 | 298 | 4 |
| 4-tert-Butylanisole CAS: 5396-38-3 | | 164 | 0.94 | 222 | 18 |
| trans-p-propenylanisole CAS: 4180-23-8 | | 148 | 0.99 | 235 | 20 |
| 1,2-Dimethoxy benzene CAS: 91-16-7 | | 138 | 1.08 | 206.7 | 22.5 |

TABLE 2-continued
| Name | Structure | MW | Density | BP (° C.) | MP (° C.) |
|---|---|---|---|---|---|
| Anisole CAS: 100-66-3 | 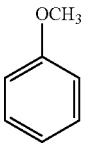 | 108 | 1.00 | 153.8 | −37.3 |
| Phenetole CAS: 103-73-1 | 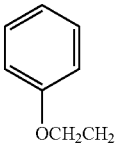 | 122 | 0.97 | 172 | −30.2 |
| 2-Methoxytoluene CAS: 578-58-5 | 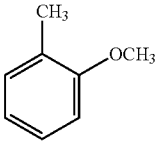 | 122 | 0.98 | 171.8 | −34 |
| 3-Methoxytoluene CAS: 100-84-5 | 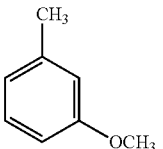 | 122 | 0.97 | 176.5 | −55.9 |
| 2,2-Dimethyl-1,3-benzodioxole CAS: 14005-14-2 | 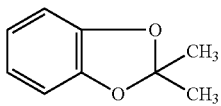 | 150 | | 182 | 3 |
| 4-Methoxytoluene CAS: 104-93-8 | 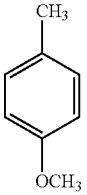 | 122 | 0.97 | 176.5 | Liquid at RT |
| Benzyl methyl ether CAS: 538-86-3 | 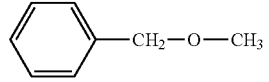 | 122.16 | 0.97 | 174 | Liquid at RT |
| 1,8-Cineole CAS: 470-82-6 | 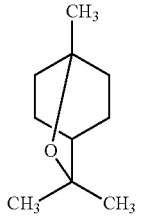 | 154 | 0.93 | 176 | Liquid at RT |
| Allyl phenyl ether CAS: 1746-13-0 | 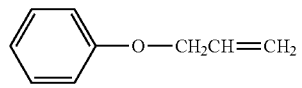 | 134 | 0.98 | 195 | Liquid at RT |

TABLE 2-continued

| Name | Structure | MW | Density | BP (° C.) | MP (° C.) |
|---|---|---|---|---|---|
| 2,3-Dihydro-2-methylbenzofuran CAS: 1746-11-8 | | 134 | 1.04 | 198 | Liquid at RT |
| 2,3-Dihydrobenzofuran CAS: 496-16-2 | | 120 | 1.09 | 189 | Liquid at RT |
| 3,5-Dimethyl anisole CAS: 874-63-5 | | 136 | 0.96 | 193 | Liquid at RT |
| 2,5-Dimethyl anisole CAS: 1706-11-2 | | 136 | 0.97 | 194 | Liquid at RT |
| 4-Ethylanisole CAS: 1515-95-3 | | 136 | 0.96 | 195 | Liquid at RT |
| 2-Ethylanisole CAS: 14804-32-1 | | 136 | 0.96 | 187 | Liquid at RT |
| 1,2-Methylene dioxybenzene CAS: 274-09-9 | | 122 | 1.19 | 172 | Liquid at RT |

(MW = molecular weight, BP = boiling point at 1 atm, MP = melting point at 1 atm)

In some cases, the aromatic ether solvent may be a blend of two or more aromatic ether solvents. In some cases, the liquid composition itself may use a blend of solvents, including solvents that are not aromatic ether solvents of the present invention. In such cases, the aromatic ether solvent(s) constitutes at least 50% (by volume) of the solvent volume in the liquid composition.

The organic semiconductor material may be any of those described above. In some cases, the organic semiconductor material is an emissive phosphorescent compound. Any of various types of emissive phosphorescent compounds may be suitable, including the organometallic complexes of transition metals described in U.S. Pat. No. 6,902,830 (Thompson et. al.); and U.S. Published Appln. No. 2006/0251923 (Lin et al.), No. 2007/0088167 (Lin et al.), No. 2006/0008673 (Kwong et al.), and No. 2007/0003789 (Kwong et al.), all of which are incorporated by reference herein.

The concentration of the organic semiconductor material in the liquid composition will vary according to the particular application. In certain embodiments, the organic semiconductor material is provided at a concentration that is suitable for inkjet printing. In some cases, the concentration of the organic semiconductor material is in the range of 0.01-10 wt %; and in some cases, in the range of 0.01-2 wt %; and in some cases, in the range of 0.1-1 wt %.

The viscosity of the liquid composition will vary according to the particular application. For use in inkjet printing, an appropriate viscosity can be in the range of 1-25 mPas or 5-25 mPas. The interaction of the aromatic ether solvent with the organic semiconductor material may affect the viscosity of the liquid composition. As such, the viscosity of the liquid composition may be adjusted by varying the selection of the aromatic ether solvent and/or the organic semiconductor material, or by varying the relative amounts of each. The liquid composition may also contain any of various other types of organic materials used in the fabrication of organic electronic devices, such as OLEDs. For example, where the liquid composition is used to make an emissive layer of an OLED, the liquid composition may further contain a host material. The organic layer may be any of those described above (e.g., a hole injection layer, a hole transporting layer, or an emissive layer in an OLED). Any of the processes described above may be used for making the organic layer with the liquid composition.

Figure 2:
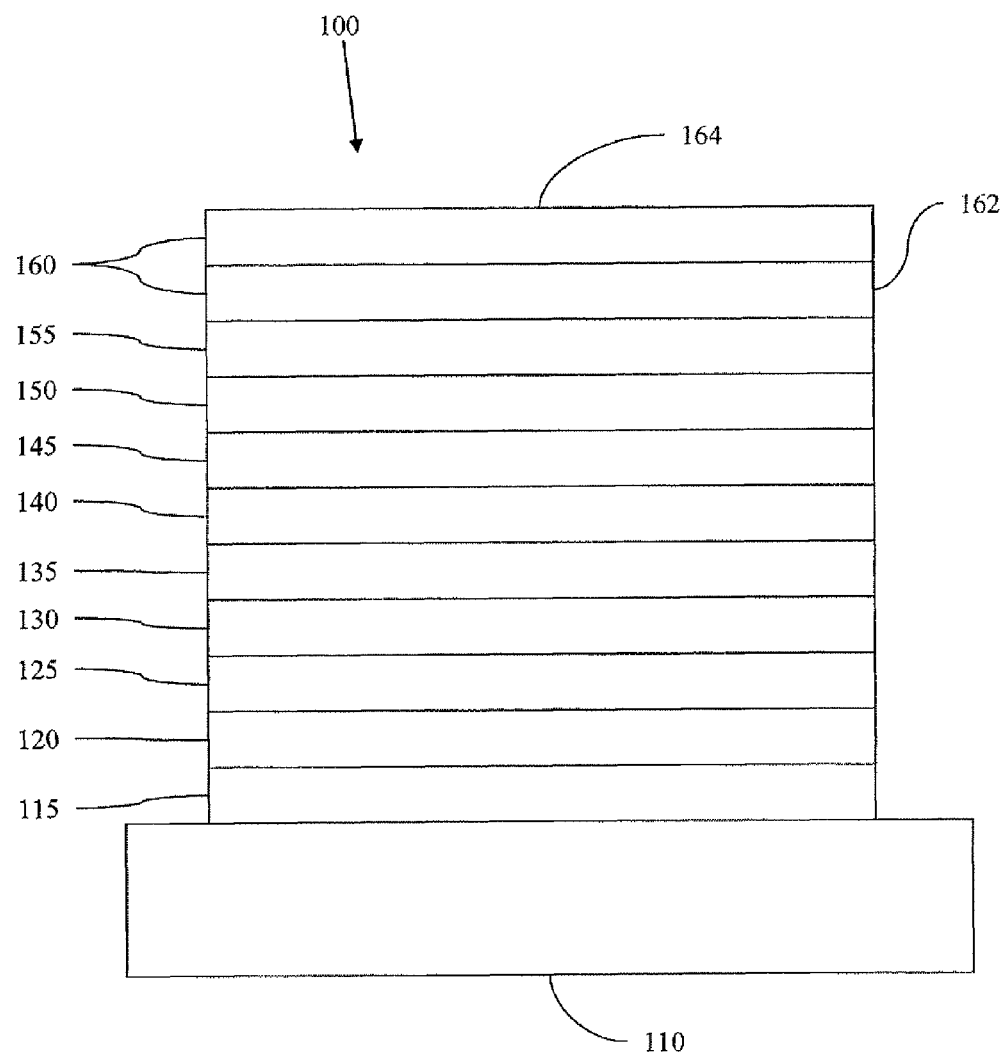
FIG. 2 shows the structure of an OLED according to an embodiment of the present invention.

The present invention can be used in the fabrication of a variety of organic electronic devices, including organic light emitting devices, organic field-effect transistors (OFETs), organic thin-film transistors (OTFTs), organic photovoltaic devices, and organic solar cells, such as those disclosed in U.S. Appln. Publication No. 2005/0072021 (Steiger et al.), which is incorporated by reference herein. For example, FIG. 2 shows an OLED 100 that may be made using the present invention. OLED 100 has an architecture that is well-known in the art (see, for example, U.S. Appln. Publication No. 2008/0220265 to Xia et al., which is incorporated by reference herein). As seen in FIG. 2, OLED 100 has a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Where a first layer is described as being "over" a second layer, the first layer is disposed further away from substrate. There may be other layers between the first and second layer, unless it is specified that the first layer is "in physical contact with" the second layer. For example, a cathode may be described as being disposed "over" an anode, even though there are various organic layers in between.

The present invention may be suitable for making any of the various organic layers in an OLED. For example, referring back to FIG. 2, the present invention may be used in making the hole injection layer 120. In this case, the surface on which the liquid composition is deposited is anode 115. Anode 115 may be any suitable anode that is sufficiently conductive to transport holes to the organic layers. The material used to make anode 115 preferably has a work function higher than about 4 eV (a "high work function material"). Preferred anode materials include conductive metal oxides, such as indium tin oxide (ITO), indium zinc oxide (IZO), and aluminum zinc oxide (AlZnO). In another example, the present invention may be used for making the hole transport layer 125. In another example, the present invention may be used for making the emissive layer 135.

Examples

Specific representative embodiments of the invention will now be described, including how such embodiments may be made. It is understood that the specific methods, materials, conditions, process parameters, apparatus, and the like do not necessarily limit the scope of the invention.

Organic layers were made by inkjet printing using various solvents. The inkjet fluids were prepared by dissolving Compound 1 (a cross-linkable iridium complex) shown below in 4 different solvents at a concentration of 0.1 wt %.

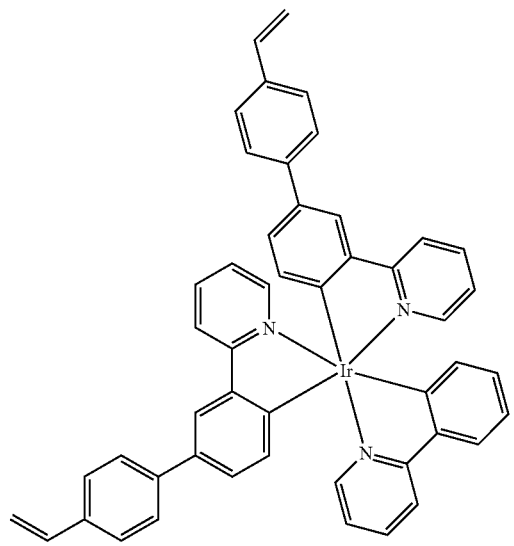

Compound 1

The solvents used were N-methylpyrrolidone (NMP), ethyl benzoate, benzyl acetate, and 1-tetralone and their boiling points and densities are shown in Table 3 below. As seen in this table, these 4 solvents have similar boiling points and densities.

TABLE 3

|  | NMP | ethyl benzoate | benzyl acetate | 1-tetralone |
|---|---|---|---|---|
| Boiling point (at 1 atm) | 204° C. | 213° C. | 212° C. | 256° C. |
| Density (gm/cm$^3$) | 0.9 | 1.05 | 1.054 | 1.1 |

Figure 3A:
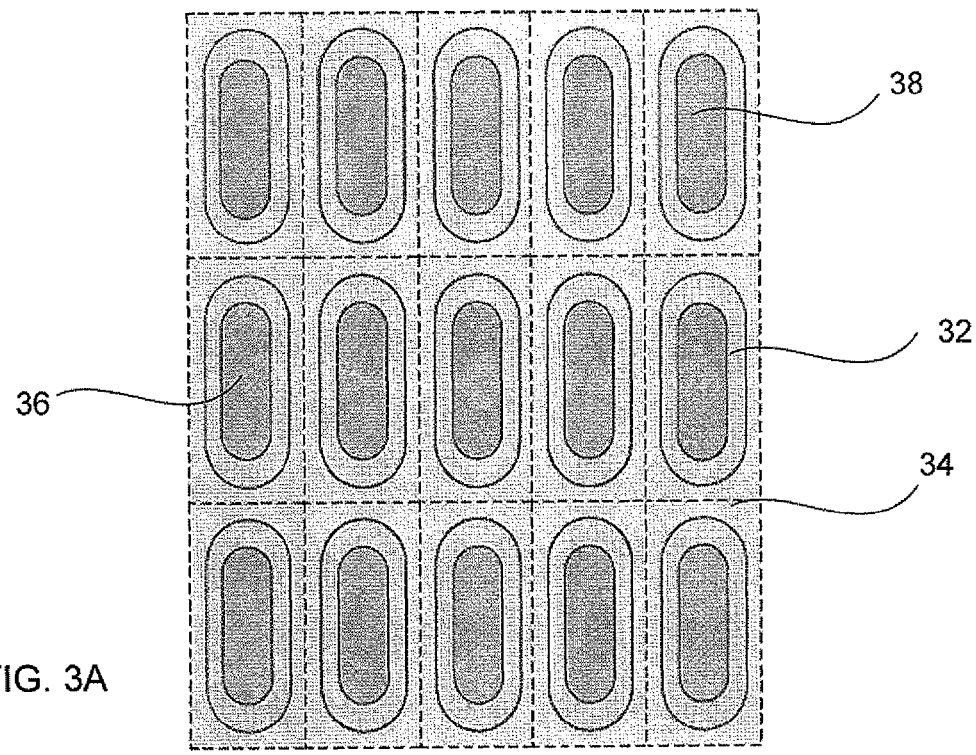
FIGS. 3A (top view) and 3B (cross-section side view) show a schematic illustration of a substrate onto which inkjet printing may be applied.
Figure 3B:
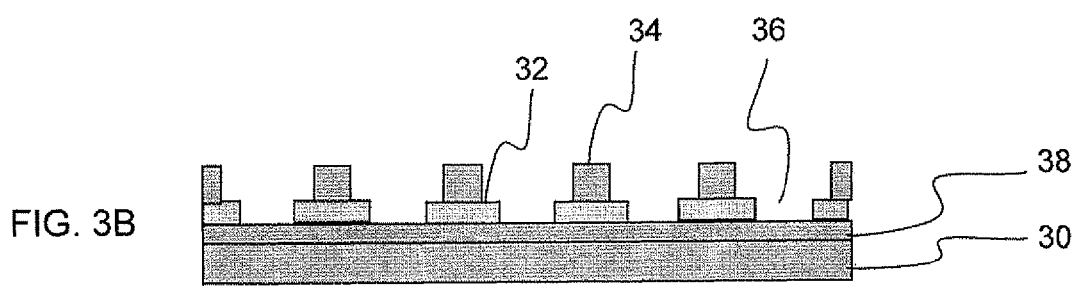

The inkjet fluids were filtered and filled into a disposable ink cartridge. The inkjet fluids for then inkjet printed onto the substrate shown in FIGS. 3A and 3B, which are schematic illustrations of a conventional substrate used in OLED fabrication. A glass substrate 30 was coated with a layer of indium tin oxide (ITO) 38 and a SiO$_2$ buffer layer 32. To form a matrix of pixels, a layer of polyimide was patterned on the ITO surface 38 to form compartments 36 which define the pixels. As seen in the cross-section side view of FIG. 3B, the compartments 36 are defined by the raised polyimide partitions 34. The polyimide partitions 34 are relatively hydrophobic compared to the surface of ITO layer 38 and SiO$_2$ buffer layer 32, or vice versa, the surface of ITO layer 38 and the SiO$_2$ buffer layer 32 is relatively hydrophilic compared to the polyimide partitions 34.

Thus, in the present invention, the surface used for depositing the liquid composition may have compartments defined by partitions, with the compartments being more hydrophilic than the partitions. By this design, the compartments can be hydrophilic relative to the ketone solvent in the liquid composition and the partitions can be hydrophobic relative to the ketone solvent such that the partitions repel the liquid composition. As a result, undesirable overflow of the deposited liquid composition over the partitions and into adjacent pixel compartments can be avoided, allowing improved planarized infill of the pixel compartments. If needed, the surface can be modified by well-known surface treatment techniques (such as oxygen or CF$_4$ plasma treatment) to adjust its hydrophilicity.

Figure 4A:
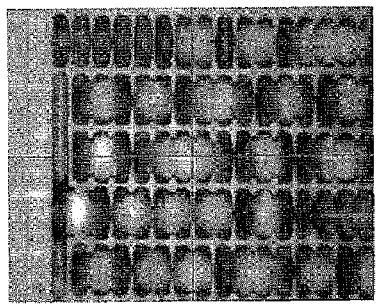
FIGS. 4A-4C shows the results from the inkjet printing of a small molecule organic semiconductor material using various organic solvents.
Figure 4A:
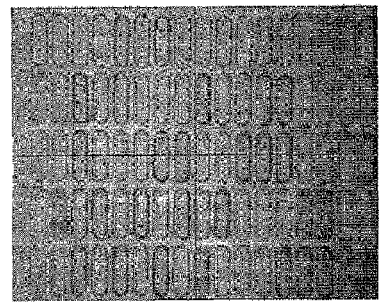
Figure 4B:
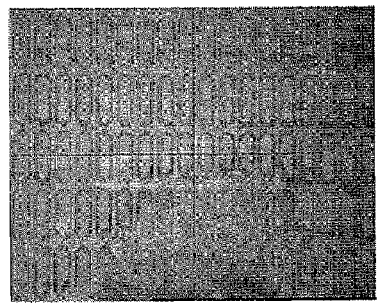
Figure 4C:
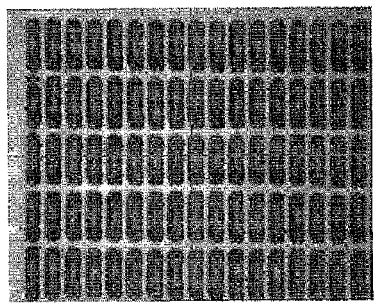
Figure 4C:
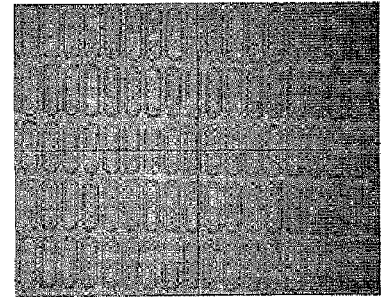

Multiple drops of the inkjet fluid were jetted into each pixel compartment on the substrate, with the results being shown in the left column of FIGS. 4A-4C. After inkjet printing, the solvents were vacuum dried at room temperature for 10 minutes, with the results being shown in the right column of FIGS. 4A-4C. The inkjet fluid using NMP as the solvent dried out too quickly and could not be printed (and is therefore, not shown in FIG. 4).

Referring to the left panel of FIG. 4A, for the inkjet fluid using ethyl benzoate as the solvent, there was an uneven distribution of the inkjet fluid drops on the substrate. As seen in the second panel of FIG. 4A, the organic layers that were formed after drying were non-uniform, with some of the pixels being too thick and others being too thin.

Referring to the left panel of FIG. 4B, for the inkjet fluid using benzyl acetate as the solvent, there was overflow of the inkjet fluid into adjacent pixel compartments. This is believed to be the result of the solvent not being able to sufficiently wet the ITO surface.

Referring to the left panel of FIG. 4C, for the inkjet fluid using 1-tetralone as the solvent, inkjet printing resulted in a very even filling of the pixels. As seen in the second panel of FIG. 4C, after drying of the organic layers, the resulting pixels were flat and uniform. This is believed to indicate, among other things, that the 1-tetralone solvent provides the inkjet fluid with sufficient viscosity for inkjet printing and the ability to sufficiently wet the ITO surface.

Obtaining such superior results with 1-tetralone as compared to the other solvents is surprising and unexpected because the other solvents were also polar solvents, like 1-tetralone, having similar boiling points and densities as 1-tetralone. Without intending to be bound by theory, it is believed that the aromatic ring on the tetralone, the ketone functional group on the tetralone, or both in combination interacts with the organic semiconductor material to provide a liquid composition having these remarkable capabilities.

With these remarkable results, a functioning OLED was made using liquid compositions of the present invention. Inkjet fluid for making the hole injection layer was prepared by dissolving the cross-linkable HIL material (a cross-linkable iridium complex) shown below in 1-tetralone at a concentration of 0.1 wt % along with the conductivity dopant shown below. As used herein, "conductivity dopant" means an organic small molecule that increases the conductivity of an organic layer of an organic electronic device when applied to the organic layer as an additive. The weight ratio between the HIL material and the conductivity dopant was 97:3. The inkjet fluid was then filtered and filled in a disposable ink cartridge.

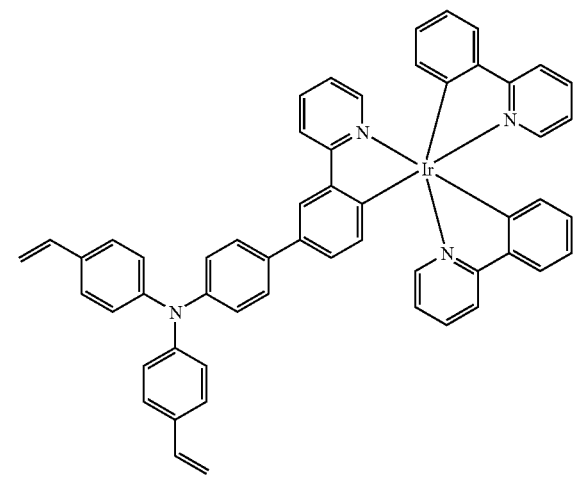

HIL material

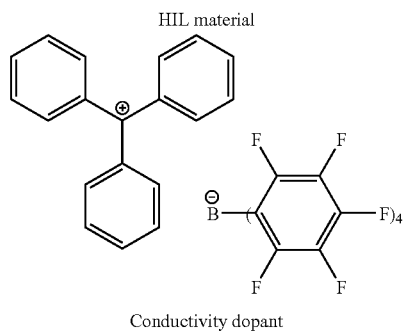

Conductivity dopant

Inkjet fluid for making the hole transporting layer was prepared by dissolving the cross-linkable HTL material shown below in 1-tetralone at a concentration of 0.2 wt %. The inkjet fluid was then filtered and filled in a disposable ink cartridge.

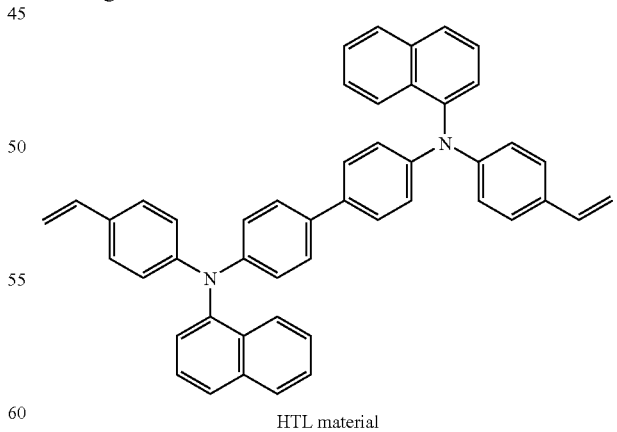

HTL material

Inkjet fluid for making the emissive layer was prepared by dissolving the EML host material shown below in 3-phenoxy-toluene at a concentration of 1.0 wt % along with the phosphorescent green dopant material shown below at a host:dopant ratio of 88:12 by weight. The inkjet fluid was then filtered and filled in a disposable ink cartridge.

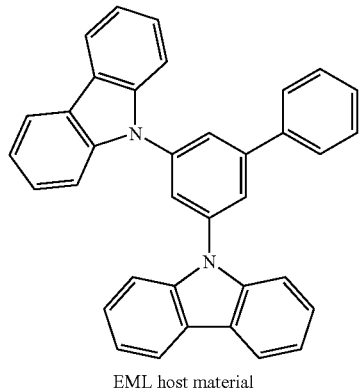

EML host material

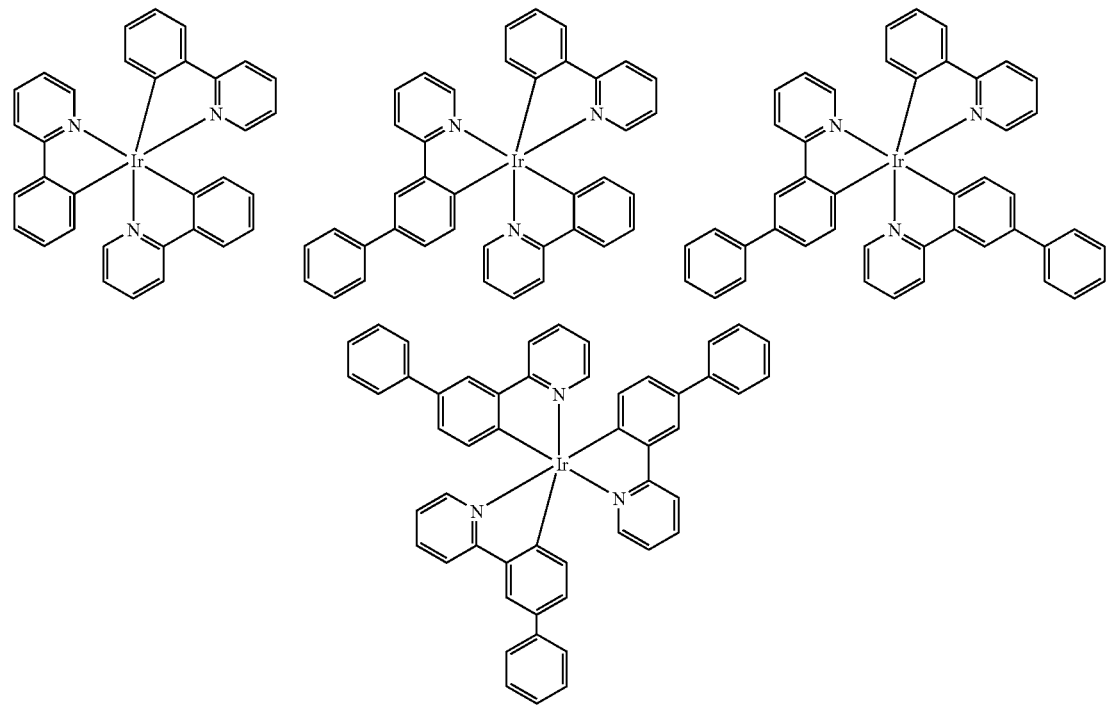

Green dopant: A mixture of the above compounds.

The hole injection layer was made by inkjet printing of the HIL inkjet fluid onto a substrate similar to that shown in FIG. 3, followed by vacuum drying for 10 mins. at room temperature. The resulting organic layer was then subjected to hot plate baking at 250° C. for 30 mins. to remove more solvent and to cross-link the HIL material. The hole transporting layer was made by inkjet printing of the HTL inkjet fluid onto the cross-linked hole injection layer, following by vacuum drying for 10 mins. at room temperature. The resulting organic layer was then subjected to hot plate baking at 200° C. for 30 mins. to remove more solvent and to cross-link the HTL material. The emissive layer was made by inkjet printing of the EML inkjet fluid onto the cross-linked hole transport layer, following by vacuum drying for 10 mins. at room temperature, and then followed by baking at 100° C. for 60 minutes.

A hole blocking layer containing the compound HPT (shown below), an electron transport layer containing Alq3 [aluminum(III)tris(8-hydroxyquinoline)], an electron injection layer containing LiF, and an aluminum electrode (cathode) were sequentially vacuum deposited in a conventional fashion.

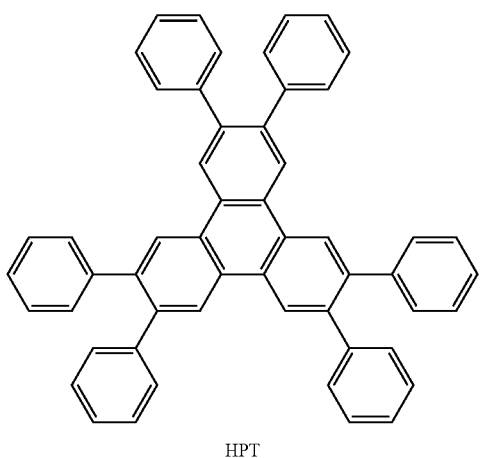

HPT

Figure 5:
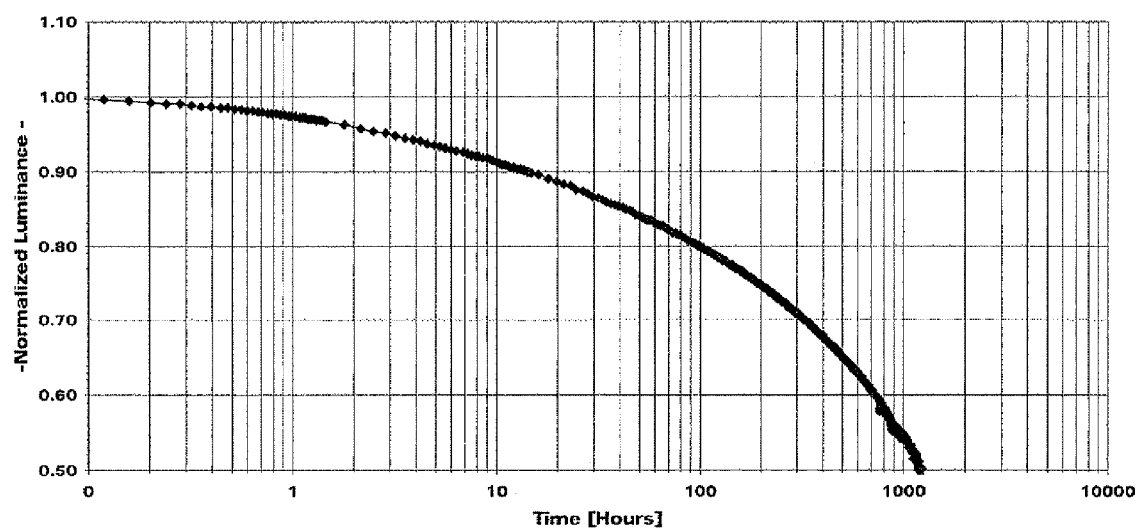
FIG. 5 shows the lifetime (plotted as luminance v. time) of an OLED made according to an embodiment of the present invention.

The resulting green-emitting OLED was operated under a constant DC current of 20 mA/cm² at room temperature to test its performance. FIG. 5 shows the operating lifetime of the device, depicted as a plot of luminous intensity over time. As seen in FIG. 5, the device had a 100 hour lifetime (as measured by the time elapsed for decay of brightness to 80% of the initial level of 2000 cd/m²). The device performance results are summarized in Table 4 below.

TABLE 4

| Voltage @ 10 mA/cm² | Luminous efficiency @ 10 mA/cm² | CIE coordinates (x, y) | Lifetime (LT$_{80}$) |
|---|---|---|---|
| 8.1 volts | 36.8 cd/A | (0.31, 0.64) | 100 hours |

Inkjet printing of organic layers using higher boiling point solvents could result in solvent residues remaining in the deposited organic layer. This solvent residue in the organic layer could interfere with the performance of electronic devices. Thus, one of the problems with the use of high boiling point solvents is that the solvent can be difficult to remove from the deposited organic layer. Baking at high temperatures can accelerate the removal of the solvent, but this can cause heat degradation of the device. Also, even baking at high temperatures may not completely remove the solvent residue from the deposited organic layer.

Figure 6A:
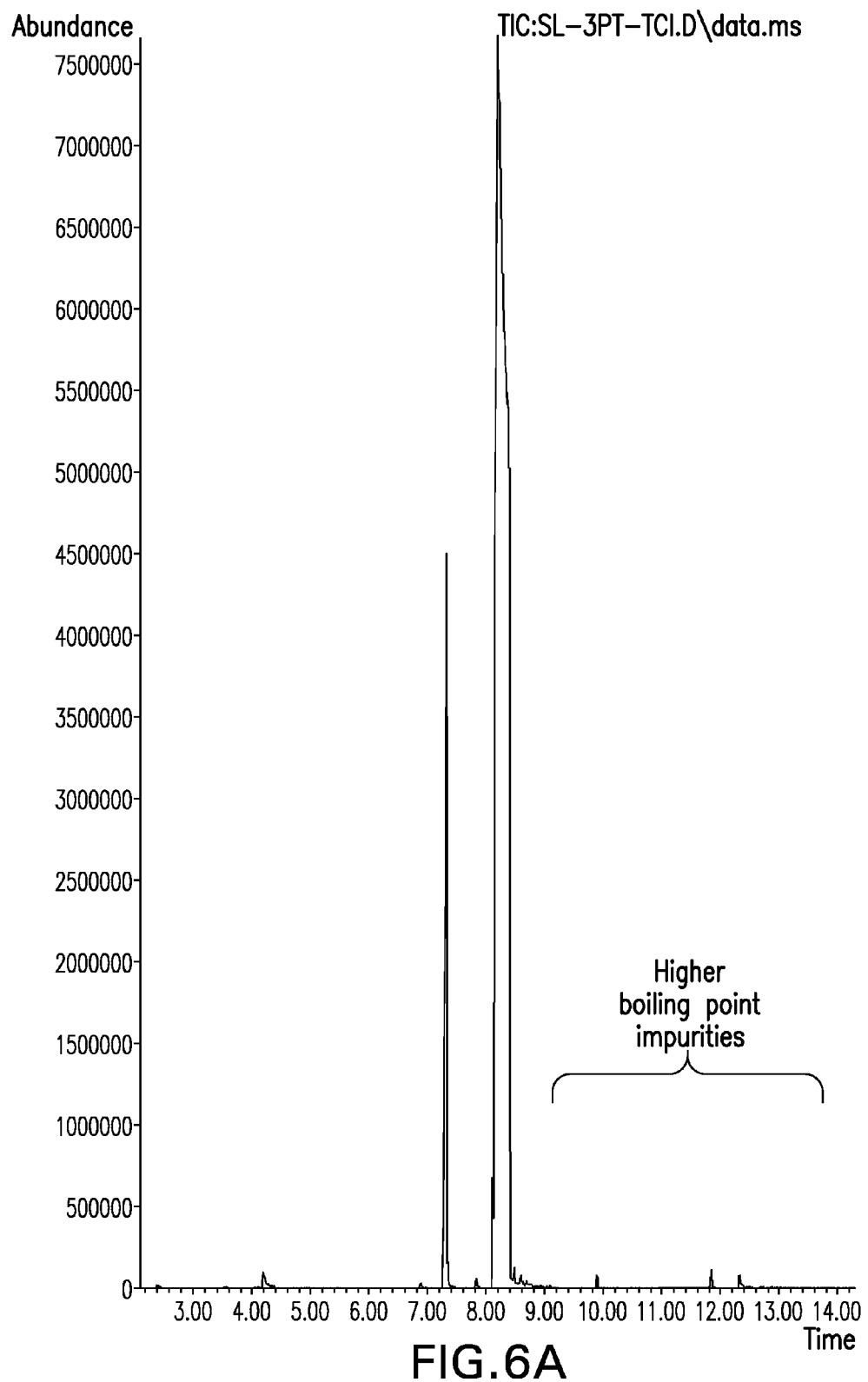
FIG. 6A shows a gas chromatogram and FIG. 6B shows a UV-HPLC output of a commercially-obtained 3-phenoxytoluene solvent preparation before redistillation.
Figure 6B:
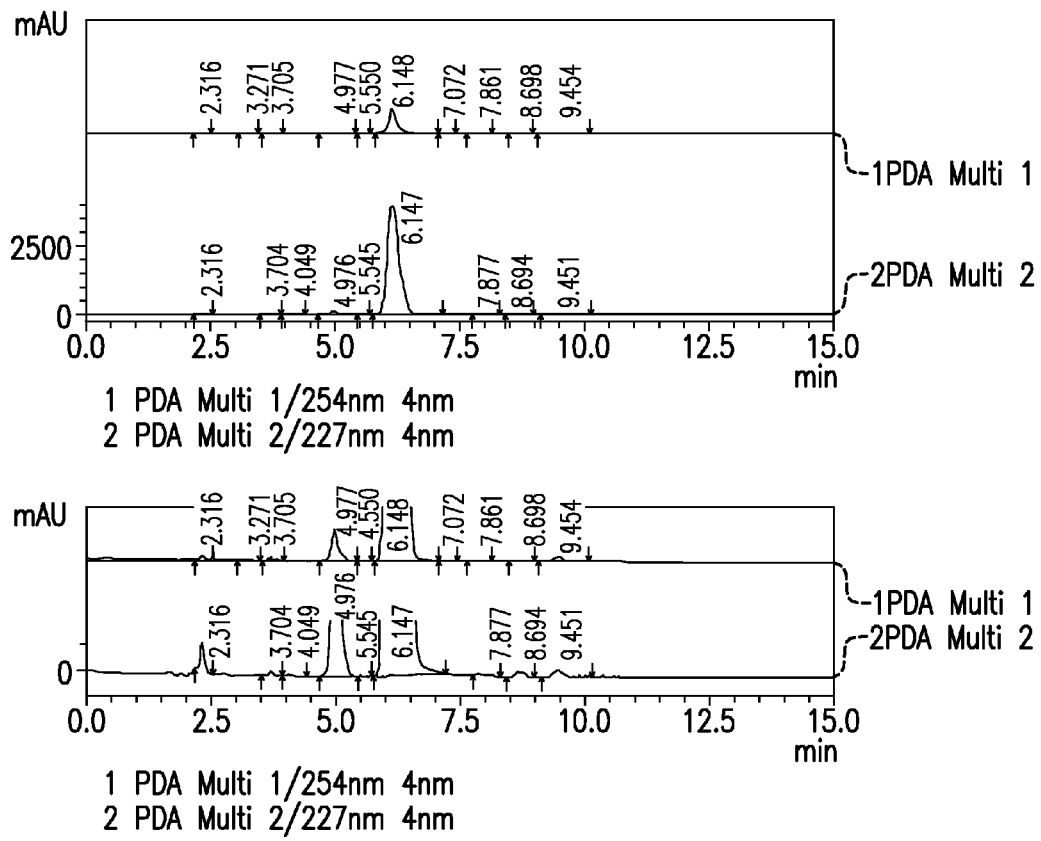

The solvent residue in the inkjet-deposited organic layer may be the solvent itself or the impurities in the solvent preparation. But in the case of high boiling point solvents, it is believed that the solvent itself would be the predominant residue in the organic layer, rather than any impurities. For example, commercially-available 3-phenoxytoluene solvent preparations are typically 95-99% pure (i.e., having an impurity content of 1-5 wt %). The 3-phenoxytoluene solvent preparation used in making the above-mentioned green-emitting OLED was obtained from TCI America (Portland, Oreg.). To investigate the impurity content of this 3-phenoxytoluene solvent preparation obtained from TCI America (Portland, Oreg.), the solvent preparation was analyzed by high-performance liquid chromatography (HPLC) and gas chromatography-mass spectrometry (GC-MS). FIG. 6A shows the gas chromatogram output performed on a sample of the 3-phenoxytoluene solvent preparation, in which the compounds elute in the order of increasing boiling point, or in other words, compounds with higher boiling points are retained longer. The main peak represents 3-phenoxytoluene (i.e., the solvent itself). The smaller peak to the left at retention time ~7.29 represents the major impurity, which is identified as being diphenylether. A number of even smaller peaks to the right of the main peak represent impurities having a higher boiling point than 3-phenoxytoluene (i.e., having a longer retention time). Likewise, the UV-HPLC (254 nm and 227 nm) output performed on a sample of the 3-phenoxytoluene solvent preparation shows a main peak, a minor peak, and a number of smaller peaks that represent 3-phenoxytoluene, diphenylether, and trace amounts of other impurities, respectively.

Figure 7A:
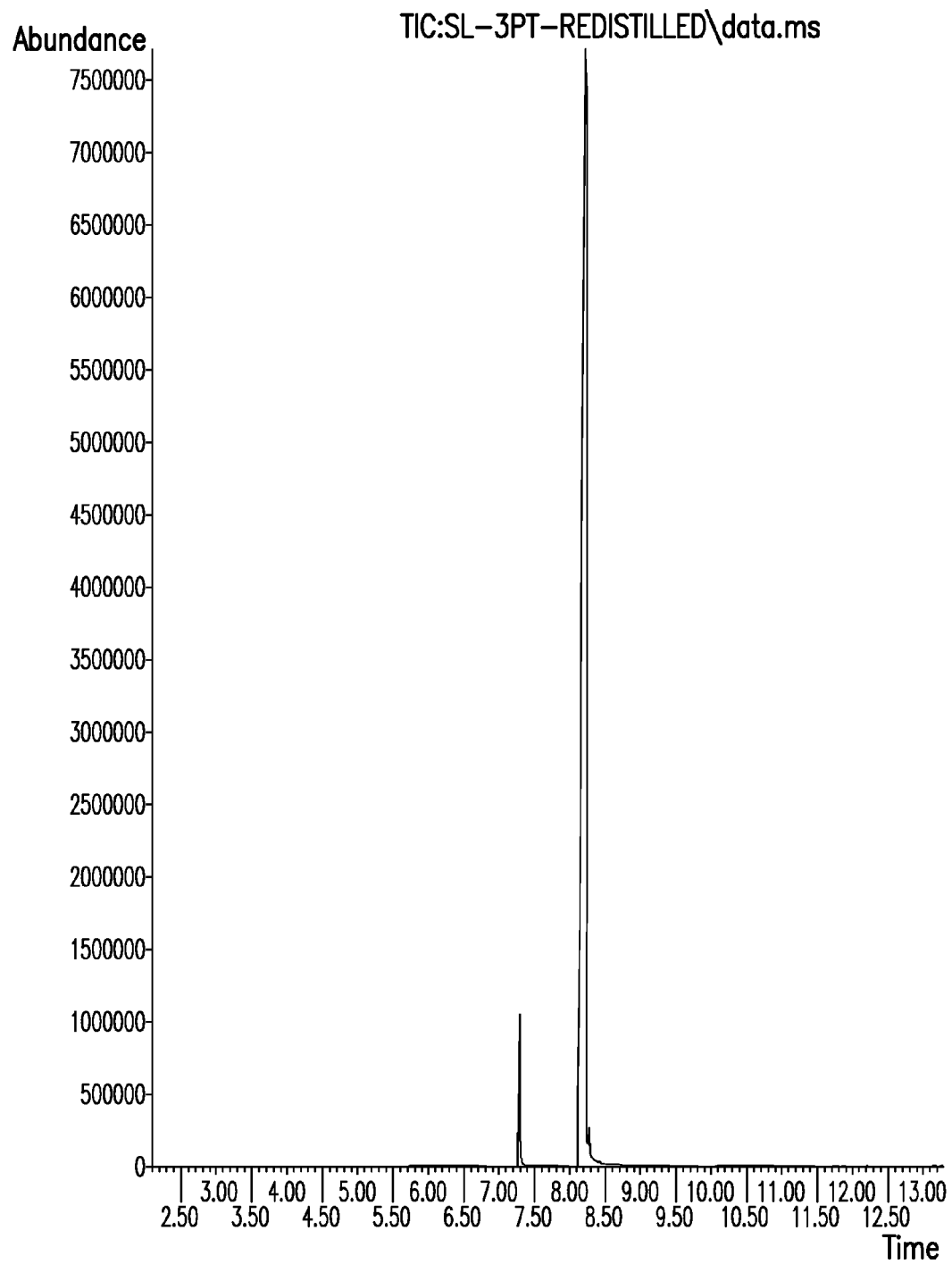
FIG. 7A shows a gas chromatogram and FIG. 7B shows a UV-HPLC output of a 3-phenoxytoluene solvent preparation after redistillation.
Figure 7B:
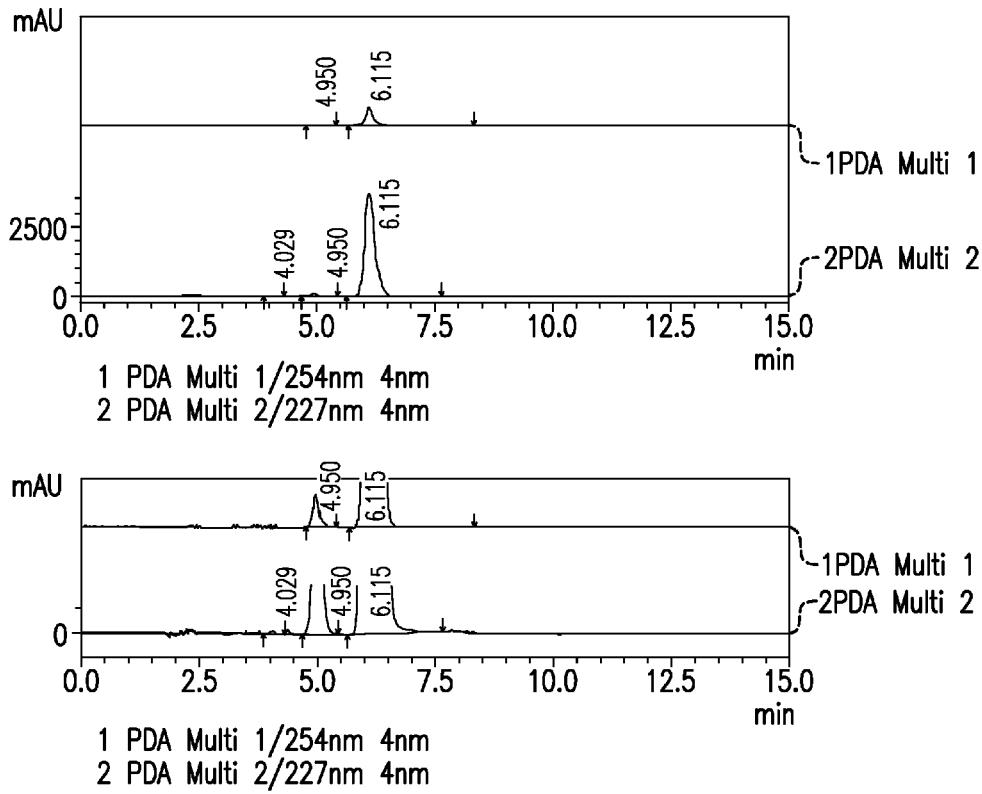

This commercially-obtained 3-phenoxytoluene solvent preparation (which will be referred to hereafter as a "crude" 3-phenoxytoluene solvent preparation, even though it is of relatively high purity and suitable for most commercial uses) was then purified by fractional redistillation as follows. All glassware were cleaned with deionised water and oven-dried for 4 hours. The crude 3-phenoxytoluene solvent preparation was placed in a round bottom flask fitted with a fractional distillation apparatus, which was connected to a vacuum pump. The distillate collection path was cooled with cold water (~18° C.). Distillate fractions were collected and analyzed by HPLC and/or GC-MS. Under 30 mbar pressure at 55° C. temperature, the collected fractions contained appreciable amounts of impurities and were therefore discarded. Fractions collected at 58-60° C. were found to contain a very small amount of impurities. FIG. 7A shows the gas chromatogram of this fraction. As seen here, the higher boiling point impurities (i.e., to the right of the main peak) are almost completely eliminated, although some of the diphenylether impurity is still present. FIG. 7B shows the UV-HPLC output of this fraction and confirms that the higher boiling point impurities have been eliminated.

This purified 3-phenoxytoluene solvent preparation was used to make OLEDs as follows. Using the same materials as the device described above, the HIL and HTL layers for the devices were made by inkjet printing using 1-tetralone as a solvent by a process similar to that described above. In the same manner as described above, the inkjet fluid for the EML was made using either the crude 3-phenoxytoluene solvent preparation (for the control device) or the purified 3-phenoxytoluene solvent preparation (for the test device). The emissive layer was made by inkjet printing of the EML inkjet fluid onto the cross-linked HTL, following by vacuum drying for 10 mins. at room temperature, and then followed by baking at 100° C. for 60 minutes. Since the baking temperature is far lower than the boiling point of 3-phenoxytoluene (272° C.), this process is not expected to completely remove the 3-phenoxytoluene from the EML. A hole blocking layer containing the compound HPT (shown below), an electron transport layer containing Alq3 [aluminum(III)tris(8 hydroxyquinoline)], an electron injection layer containing LiF, and an aluminum electrode (cathode) were sequentially vacuum deposited in a conventional fashion.

Figure 8:
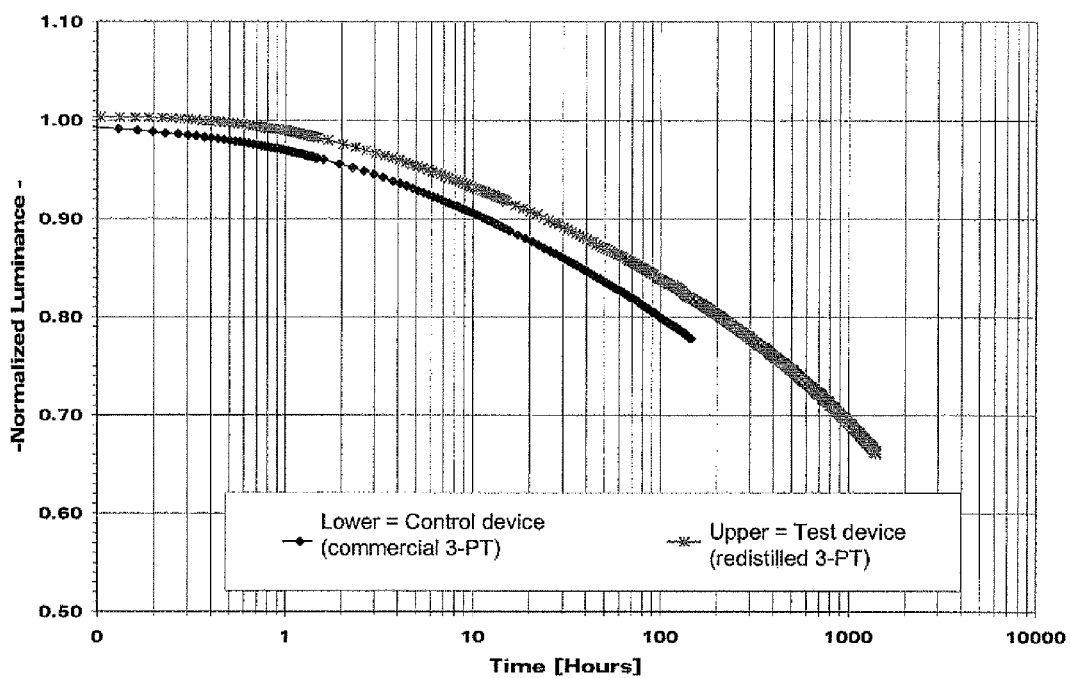
FIG. 8 shows the operating lifetime of example OLEDs depicted as a plot of luminous intensity over time.

FIG. 8 shows the operating lifetimes of the two devices as a plot of luminous intensity over time. The test device made using the purified solvent preparation had a lifetime of 200 hours (as measured by the time elapsed for decay of brightness to 80% of the initial level of 2000 cd/m², at room temperature, under a constant DC drive), as compared to 100 hours for the control device made using the crude solvent preparation.

This difference in device performance is believed to be the result of different residues remaining in the EML formed by inkjet printing using the crude solvent preparation versus the purified (redistilled) solvent preparation. However, this significant improvement in device performance was an unexpected result because, as explained above, it is believed that the solvent itself would be the predominant species in the residue, rather than any impurities in the solvent preparation. As shown above for the crude solvent preparation, the impurities constitute only a small fraction of the solvent preparation, and therefore, would constitute only a small fraction of the residue material. Removal of these small amounts of impurities would not be expected to significantly change the composition of the solvent residue, and thus, impurity removal would not be expected to have a significant effect on device performance.

Furthermore, the main impurity, diphenylether, is still present in the redistilled solvent preparation. The most significant difference between the crude solvent preparation and the redistilled solvent preparation is the absence of the higher boiling point impurities in the redistilled solvent preparation. As shown above for the crude solvent preparation, these higher boiling point impurities constitute only a small fraction of the total impurities (perhaps about 10% or less), which in turn, constitute only a small fraction of the solvent preparation. Thus, it is further surprising that the removal of these trace amounts of the higher boiling point impurities would result in such a dramatic improvement in device performance.

Thus, based on these surprising results, the present invention contemplates that device performance can be improved by making organic layers using solvent preparations having a reduced content of higher boiling point impurities. In certain embodiments, the solvent preparation comprises a high boiling point solvent and 0.1 wt % or less of impurities having a higher boiling than the solvent itself. As used herein, "high boiling point solvent" means a solvent having a boiling point of 200° C. or higher at 1 atm. Thus, 3-phenoxytoluene (BP=272° C.) and 1-tetralone (BP=256° C.) would be considered high boiling point solvents. In some cases, the high boiling point solvent is a solvent having a boiling point of 250° C. or higher (at 1 atm). The high boiling point solvent may have a boiling point as high as 350° C. (at 1 atm), but other boiling point ranges are also possible. The solvent may have a melting point of 25° C. or below to facilitate its use in inkjet printing. The solvent preparation may be made by redistilling a commercially-obtained solvent preparation.

The solvent preparation is mixed with a small molecule organic semiconductor material, in the manner described above, to form a liquid composition for making organic layers. The liquid composition is then deposited onto a surface by a solution processing technique (e.g., inkjet printing) to form the organic layer. In some cases, the concentration of the organic semiconductor material is in the range of 0.01-10 wt %; and in some cases, in the range of 0.01-2 wt %; and in some cases, in the range of 0.1-1 wt %.

Accordingly, in certain embodiments, liquid compositions of the present invention comprise a high boiling point solvent and a small molecule organic semiconductor material mixed in the high boiling point solvent. Accounting for any dissolved impurities (but not solid impurities) introduced by the solvent preparation and the small molecule organic semiconductor material, the liquid composition may have 0.1 wt % or less of impurities having a higher boiling point than the solvent.

The present invention may be suitable for making any of the various organic layers in an OLED, including the HIL, HTL, or EML. OLEDs made using the present invention may have significantly improved $T_{80}$ lifetimes (time elapsed for decay of brightness to 80% of the initial level, at room temperature, under a constant DC drive) as compared to comparative devices that are made in an identical fashion, except that the corresponding organic layer (e.g., emissive layer) is made using the crude solvent preparation. For example, the device lifetime ($T_{80}$) may be at least 1.5 times longer, and in some cases, at least twice as long as compared to the comparative device made using the crude solvent preparation.

The foregoing description and examples have been set forth merely to illustrate the invention and are not intended to be limiting. Each of the disclosed aspects and embodiments of the present invention may be considered individually or in combination with other aspects, embodiments, and variations of the invention. In addition, unless otherwise specified, none of the steps of the methods of the present invention are confined to any particular order of performance. Modifications of the disclosed embodiments incorporating the spirit and substance of the invention may occur to persons skilled in the art and such modifications are within the scope of the present invention.

We claim:

1. A method of forming an organic layer for an organic electronic device, comprising:
   having a liquid composition comprising a small molecule organic semiconductor material mixed in a solvent preparation, the solvent preparation comprising a solvent and 0.1 wt % or less of impurities having a higher boiling point than the solvent, the solvent having a boiling point of 200° C. or higher at 1 atm; and
   depositing the liquid composition on a surface.

2. The method of claim 1, wherein the solvent preparation is a purified solvent preparation, and wherein providing the liquid composition comprises:
   having a crude solvent preparation comprising the solvent and more than 0.1 wt % of impurities having a higher boiling point than the solvent;
   purifying the crude solvent preparation by removing at least some of the impurities having a higher boiling point than the solvent to obtain the purified solvent preparation; and
   mixing the small molecule organic semiconductor material with the purified solvent preparation.

3. The method of claim 1, wherein purifying the crude solvent preparation comprises distilling the crude solvent preparation.

4. The method of claim 1, wherein the solvent has a boiling point of 250° C. or higher.

5. The method of claim 1, wherein the solvent is 3-phenoxytoluene solvent.

6. The method of claim 1, wherein the solvent is 1-tetralone.

7. The method of claim 1, wherein the impurities having a higher boiling point than the solvent is essentially non-detectable by ultraviolet detection-high pressure liquid chromatography.

8. The method of claim 1, wherein the concentration of the organic semiconductor material is in the range of 0.01-2 wt %.

9. The method of claim 1, wherein the organic semiconductor material is an organometallic complex of a transition metal.

10. A method of making an organic light emitting device having an anode, a cathode, and an organic layer disposed between the anode and the cathode, wherein the organic layer is formed by the method of claim 1.

11. The method of claim 10, wherein:
   the organic layer is formed by the method of claim 2, the organic layer being an emissive layer; and
   the organic light emitting device has a $T_{80}$ lifetime at least 1.5 times longer than a comparative device that is made identically except that the emissive layer is made using the crude solvent preparation.

12. The method of claim 10, wherein the step of depositing is performed by inkjet printing.

13. A liquid composition comprising:
   a solvent having a boiling point of 200° C. or higher at 1 atm; and
   a small molecule organic semiconductor material mixed in the solvent at a concentration in the range of 0.01-10 wt %;
   wherein the liquid composition has 0.1 wt % or less of impurities having a higher boiling point than the solvent.

14. The liquid composition of claim 13, wherein the concentration of the organic semiconductor material is in the range of 0.01-2 wt %.

15. The liquid composition of claim 13, wherein the organic semiconductor material is an emissive phosphorescent compound.

16. The liquid composition of claim 15, wherein the emissive phosphorescent compound is an organometallic complex of a transition metal.

17. The liquid composition of claim 15, wherein the liquid composition further comprises a host compound for the phosphorescent compound.

18. The liquid composition of claim 17, wherein the host compound is a carbazole-containing compound.

19. The liquid composition of claim 13, wherein the solvent has a boiling point of 250° C. or higher.

20. The liquid composition of claim 13, wherein the solvent is 3-phenoxytoluene.

21. The liquid composition of claim 13, wherein the solvent is 1-tetralone.

* * * * *